United States Patent
Thanu et al.

(10) Patent No.: US 10,968,052 B2
(45) Date of Patent: *Apr. 6, 2021

(54) LONG REACH VACUUM ROBOT WITH DUAL WAFER POCKETS

(71) Applicant: Applied Materials, Inc., Santa Clara, CA (US)

(72) Inventors: Rajkumar Thanu, Santa Clara, CA (US); Damon K. Cox, Jarrell, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/828,537

(22) Filed: Mar. 24, 2020

(65) Prior Publication Data

US 2020/0399077 A1   Dec. 24, 2020

Related U.S. Application Data

(63) Continuation of application No. 16/445,550, filed on Jun. 19, 2019, now Pat. No. 10,710,819.

(51) Int. Cl.

| | | |
|---|---|---|
| *B65G 47/91* | (2006.01) | |
| *B25J 15/06* | (2006.01) | |
| *H01L 21/67* | (2006.01) | |
| *B25J 9/00* | (2006.01) | |
| *H01L 21/687* | (2006.01) | |

(52) U.S. Cl.
CPC .......... *B65G 47/918* (2013.01); *B25J 9/0087* (2013.01); *B25J 15/0616* (2013.01); *H01L 21/6719* (2013.01); *H01L 21/67196* (2013.01); *H01L 21/68707* (2013.01); *B65G 2201/0297* (2013.01)

(58) Field of Classification Search
None
See application file for complete search history.

(56) References Cited

U.S. PATENT DOCUMENTS

| | | |
|---|---|---|
| 6,132,165 A | 10/2000 | Carducci |
| 2011/0076117 A1 | 3/2011 | Iizuka |
| 2017/0040204 A1 | 2/2017 | Kim et al. |
| 2017/0047236 A1 | 2/2017 | Shin et al. |
| 2017/0084880 A1 | 3/2017 | Kurita et al. |

FOREIGN PATENT DOCUMENTS

KR       100803559       2/2008

OTHER PUBLICATIONS

International Search Report and Written Opinion for International Application No. PCT/US2020/037957, dated Sep. 24, 2020, 10 pages.

*Primary Examiner* — Ronald P Jarrett
(74) *Attorney, Agent, or Firm* — Lowenstein Sandler LLP

(57) ABSTRACT

A robotic handling system includes a transfer chamber and a robot arm disposed within the transfer chamber with an end effector having a longitudinal axis. The end effector includes a first wafer pocket defined within the end effector at a first location and a second wafer pocket defined within the end effector at a second location along the longitudinal axis. A first chamber, coupled to the transfer chamber, is reachable by the first wafer pocket and by the second wafer pocket. A second chamber, coupled to the first chamber, where the first chamber is positioned between the transfer chamber and the second chamber, and the second chamber is reachable by the first wafer pocket but not the second wafer pocket.

20 Claims, 11 Drawing Sheets

US 10,968,052 B2

LONG REACH VACUUM ROBOT WITH DUAL WAFER POCKETS

RELATED APPLICATION

This application is a continuation of U.S. patent application Ser. No. 16/445,550, filed Jun. 19, 2019, which is hereby incorporated in its entirety herein by reference.

TECHNICAL FIELD

Embodiments of the present disclosure relate to the use of dual wafer pockets on an end effector of a long reach robot arm.

BACKGROUND

A chip manufacturing facility is composed of a broad spectrum of technologies. Cassettes containing semiconductor substrates (e.g., wafers) are routed to various stations in a facility where they are either processed or inspected. Semiconductor processing generally involves the deposition of material onto and removal ("etching" and/or "planarizing") of material from substrates. Typical processes include chemical vapor deposition (CVD), plasma enhanced CVD (PECVD), physical vapor deposition (PVD), electroplating, chemical mechanical planarization (CMP), and etching, among others.

One concern in semiconductor processing is substrate throughput. Generally, the greater the substrate throughput, the lower the manufacturing cost and therefore the lower the cost of the processed substrates. In order to increase substrate processing throughput, batch processing chambers have been developed as have been systems that employ more than one end effector on a robot arm within a multi-chamber processing system.

In semiconductor processing and other electronics processing, platforms employ the use of robot arms to transport objects such as the wafers between process chambers, from storage areas to process chambers, from process chambers to storage areas, and so on. Customers using these platforms seek capability to have a greater number of process steps, and thus higher throughput of processed substrates, without damaging the vacuum robot, which employs a robotic arm, from over use.

SUMMARY

Some of the embodiments described herein cover a processing system include a robot arm with an end effector having a longitudinal axis, the robot arm having a reach of at least 45 inches. In other embodiments, the robot arm may have a reach of about 39 inches, a reach of about 50 inches, or reaches with other lengths. The end effector includes a first wafer pocket defined within the end effector at a first location along the longitudinal axis, where the first wafer pocket has the reach of at least 45 inches (or 39 inches or 50 inches, depending on the embodiment). The end effector includes a second wafer pocket defined within the end effector at a second location along the longitudinal axis, where the second wafer pocket has a second reach that is less than 45 inches (or less than 39 inches or less than 50 inches, depending on the embodiment). The end effector is capable of concurrently carrying a first wafer in the first wafer pocket and a second wafer in the second wafer pocket.

In some embodiments, a method includes extending a robot arm with an end effector having a first wafer pocket and a second wafer pocket. The first wafer pocket is located at a distal end of the end effector along a longitudinal axis and the second wafer pocket is located at a second position on the end effector along the longitudinal axis. The method may further include picking up, at the first wafer pocket of the end effector, a first wafer from a load lock. The method may further include delivering the first wafer to an interim station positioned between the load lock and a transfer chamber that includes the robot arm. The method may further include picking up, at the first wafer pocket, a second wafer from the load lock while concurrently picking up, at the second wafer pocket, the first wafer located in the interim station. The method may further include concurrently placing the first wafer on a first substrate support of at least one processing chamber and the second wafer on a second substrate support of the at least one processing chamber.

In some embodiments, a robotic handling system includes a transfer chamber and a robot arm disposed within the transfer chamber. The robot arm includes an end effector having a longitudinal axis, the robot arm having a reach of at least 45 inches, at least 50 inches, or at least 39 inches. The end effector includes a first wafer pocket defined within the end effector at a first location along the longitudinal axis, where the first wafer pocket has the reach of at least 45 inches, at least 50 inches, or at least 39 inches. The end effector additionally includes a second wafer pocket defined within the end effector at a second location along the longitudinal axis, wherein the second wafer pocket has a second reach that is less than 45 inches, less than at least 50 inches, or less than at least 39 inches. The robotic handling system may further include a plurality of additional chambers coupled to the transfer chamber. Each additional chamber is reachable by the first wafer pocket and the second wafer pocket. The robotic handling system may further include a plurality of processing chambers within reach of the robot arm, where each additional chamber is positioned between the transfer chamber and one of the plurality of processing chambers. Each of the plurality of processing chambers may be reachable by the first wafer pocket but not the second wafer pocket.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for transporting semiconductor substrates, referred to herein as wafers for simplicity, two at a time on an end effector of a long reach robot arm of a vacuum robot. The vacuum robot may be part of a larger substrate processing system used to process wafers. In particular, embodiments enable the use of the long reach robot arm to transfer the two wafers on two wafer pockets defined within the end effector of the long reach robot arm, where the two wafer pockets are situated along a longitudinal axis of the end effector.

Some embodiments further employ interim stations, which are positioned between a transfer station that includes the vacuum robot and the processing chambers, to facilitate use of the end effector of the robot arm to pick up unprocessed wafers from a load lock, pick up processed wafers from a processing chamber, deliver unprocessed wafers to a processing chamber, and/or deliver processed wafers to the load lock. For example, a first wafer may be temporarily delivered by the end effector to the interim station followed by the end effector concurrently picking up the first wafer in the interim station and a second wafer, which is still in the load lock, and delivering the first and second wafers to a processing chamber. The interim stations are also used to help load and retrieve the wafers from processing chambers in some embodiments.

Embodiments described herein that employ the long reach robot arm having one or more end effectors include various advantages over the current vacuum robots in the art. These advantages include the ability to carry multiple wafers, e.g., at least two wafers on dual wafer pockets of each end effector. The wafer pockets may be multiplied beyond two, for example, to carry more than two wafers. The wafers may therefore pick up and set down at least two wafers at a time. This increases substrate throughput without a corresponding increase in stress on the vacuum robot.

Accordingly, it should be understood that embodiments discussed herein with reference to two wafer pockets also apply to more than two wafer pockets, which may all be arranged (e.g., may be collinear) along a same axis or may be arranged along two or more axes. In an embodiment with more than one axis, there may be a first pair of wafer pockets (side by side) where the first wafer pocket is illustrated herein and a second pair of wafer pockets (side by side) where the second wafer pocket on an end effector is illustrated herein. In this way a first and a second wafer pocket may oriented along a first longitudinal axis and a second and a third wafer pocket may be oriented along a second longitudinal axis that is generally parallel to the first longitudinal axis.

Figures 1A, 1B, 1C:
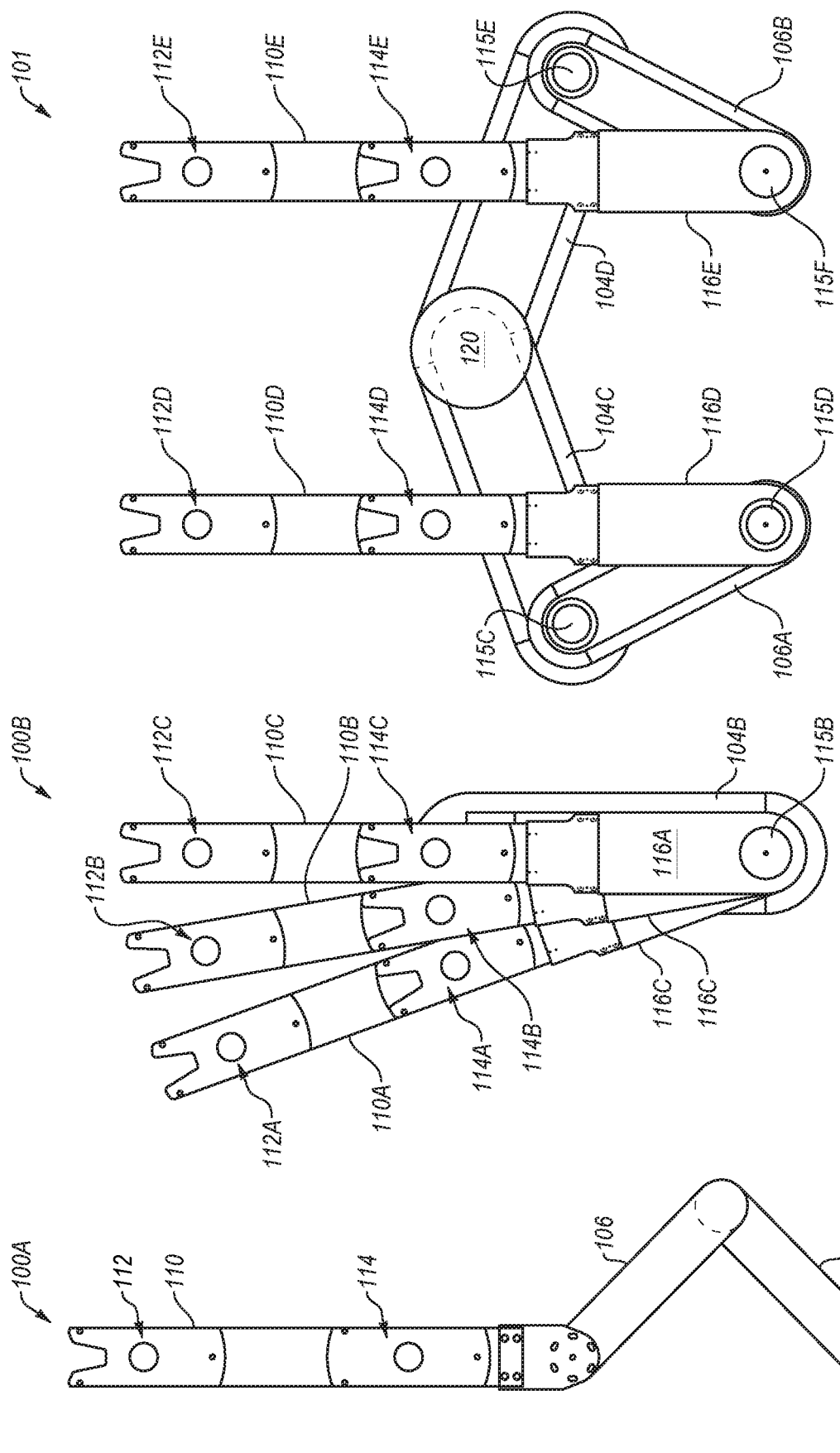
FIG. 1A illustrates a top view of an example long reach robot arm with one end effector, according to one aspect of the disclosure.
FIG. 1B illustrates a top view of an example long reach robot arm with multiple, independent end effectors, according to one aspect of the disclosure.
FIG. 1C illustrates a top view of an example long reach robot arm with dual end effectors, according to one aspect of the disclosure.

FIGS. 1A, 1B, and 1C illustrate top views of different embodiments of long reach robot arms that include end effectors having a first wafer pocket and a second wafer pocket. FIG. 1A illustrates a top view of an example long reach robot arm 100A with one end effector, according to one aspect of the disclosure. More specifically, the robot arm 100A includes an upper arm 104A, a middle arm 106 operatively coupled to the upper arm 104A, and an end effector 110 operatively coupled to the middle arm 106. The end effector 110 includes a first wafer pocket 112 and a second wafer pocket 114 attached to the end effector 110 and defined within the end effector 110 along a longitudinal axis defined by a length of the end effector 110. Each the first and second wafer pockets 112 and 114 (as well as other wafer pockets described herein) include a slight depression having a nominal center where the wafer or substrate will rest during transport in embodiments.

In embodiments, the long reach robot arm 100A further includes a drive motor assembly 115A that has a drive motor operatively coupled to the upper arm 104A, to actuate the long reach robot arm 100A around an axis of the robot arm. The driver motor is to cause the end effector 110 to at least one of: a) concurrently deliver the first wafer and the second wafer to respective destinations that are approximately aligned along the longitudinal axis; or b) concurrently withdraw the first wafer and the second wafer from respective locations that are approximately aligned along the longitudinal axis.

In some embodiments, the robot arm 100A has a reach of at least 45 inches. In some embodiments, the robot arm 100A has a reach of at least 50 inches. In some embodiments, the robot arm 100A has a reach of at least 39 inches. In other embodiments, the robot arm 100A may have a reach of a different distance. The robot arm 100A includes a first wafer pocket 112 defined within the end effector 110 at a first location along the longitudinal axis. The first wafer pocket 112 may have a first reach that may be approximately the same as the reach of the robot arm (e.g., a reach of at least 45 inches, a reach of at least 50 inches, a reach of at least 39 inches, or another distance of reach). The end effector 110 may further include a second wafer pocket 114 defined within the end effector 110 at a second location along the longitudinal axis. The second wafer pocket 114 may have a second reach that is less than the reach of the first wafer pocket (e.g., a reach of less than 45 inches, a reach of less than 50 inches, a reach of less than 39 inches, and so on). The end effector 110 may be capable of concurrently carrying a first wafer in the first wafer pocket 112 and a second wafer in the second wafer pocket 114, as will be illustrated.

FIG. 1B illustrates a top view of an example long reach robot arm 100B with multiple, independent end effectors, according to one aspect of the disclosure. More specifically, the long reach robot arm 100B includes an upper arm 104B operatively coupled to a first end effector 110A, a second end effector 110B, and a third end effector 110C (each of which may be referred to as blades in embodiments). The long reach robot arm 100B may further include a drive motor assembly 115B that includes a drive motor and gears for each respective end effector. In other words, the drive motor assembly 115B may independently operate, using a control circuit, each of the first end effector 110A, the second end effector 110B, and the third end effector 110C.

In embodiments, the first end effector 110A includes a first wafer pocket 112A and a second wafer pocket 114A situated similarly as discussed with reference to the first and second wafer pockets 112 and 114 of the end effector 110 illustrated in FIG. 1A. The second end effector 110B includes a third wafer pocket 112B and a fourth wafer pocket 114B situated similarly as discussed with reference to the first and second wafer pockets 112 and 114 of the end effector 110 illustrated in FIG. 1A. The third end effector 110C includes a fifth wafer pocket 112C and a sixth wafer pocket 114C situated similarly as discussed with reference to the first and second wafer pockets 112 and 114 of the end effector 110 illustrated in FIG. 1A. In this way, the long reach robot arm 100B may carry up to six wafers on the six wafer pockets of its three end effectors or blades. Note that a wrist member may be positioned between the upper arm 104B and each end effector, e.g., respectively, a first wrist member 116A, a second wrist member 116B, and a third wrist member 116C. The wrist members 116A-C may be rotatable about an outboard end of the upper arm 104B in embodiments and facilitate movement between the upper arm 104B and each respective end effector. For simplicity, the wrist members may be referred to as part of the end effector herein.

FIG. 1C illustrates a top view of an example long reach robot arm 101 with dual end effectors, according to one aspect of the disclosure. More specifically, the long reach robot arm 101 may include two separate robot arms, each of which may be articulated separately or jointly moved together. In embodiments, the long reach robot arm 101 includes a first upper arm 104C, a first middle arm 106A operatively coupled to the first upper arm 104C, and a first end effector 110D operatively coupled to the first middle arm 106A. In one embodiment, the first end effector 110D includes a first wafer pocket 112D and a second wafer pocket 114D situated similarly as discussed with reference to the first and second wafer pockets 112 and 114 of the end effector 110 illustrated in FIG. 1A. Note that a first wrist member 116D may be positioned between the first middle arm 106A and the first end effector 110D.

With further reference to FIG. 1C, the long reach robot arm 101 may include a second upper arm 104D, a second middle arm 106B operatively coupled to the first upper arm 104D, and a second end effector 110E operatively coupled to the second middle arm 106B. In one embodiment, the second end effector 110E includes a third wafer pocket 112E and a fourth wafer pocket 114E situated similarly as discussed with reference to the first and second wafer pockets 112 and 114 of the end effector 110 illustrated in FIG. 1A. In this way, the long reach robot arm 101 may carry a total of four wafers on its first and second end effectors. Note that a second wrist member 116E may be positioned between the second middle arm 106B and the second end effector 110E.

In one embodiment, the long reach robot arm 101 further includes a mating gear 120 around which proximal ends of the first and second upper arms 104C and 104D can attach and freely rotate. The long reach robot arm 101 may further include a first motor drive assembly 115C to operatively couple the first upper arm 104C to a first end of the first middle arm 106A and a second motor drive assembly 115D to operatively couple a second end of the first middle arm 106A to the fourth end effector 110D. The first motor drive assembly 115C and the second motor drive assembly 115D may work cooperatively to extend and withdraw the first end effector 110D along a straight line. The long reach robot arm 101 may further include a third motor drive assembly 115E to operatively couple the second upper arm 104D to a first end of the second middle arm 106B and a fourth motor drive assembly 115E to operatively couple a second end of the second middle arm 106B to the second end effector 110E. The third motor drive assembly 115E and the second motor drive assembly 115F may work cooperatively to extend and withdraw the second end effector 110E along a straight line.

Figure 2A:
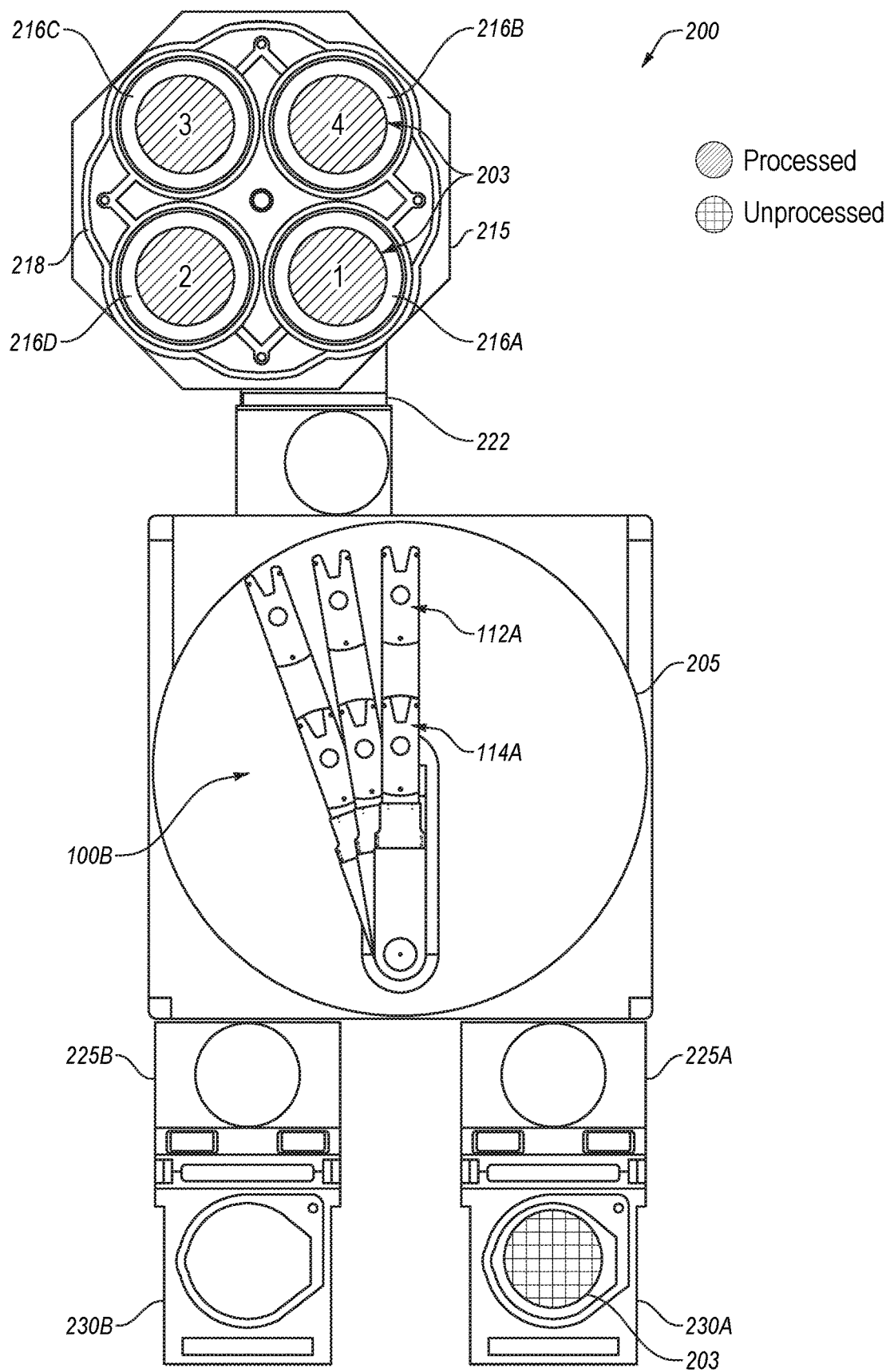
FIG. 2A illustrates a simplified top view of a portion of a processing system that employs a quad processing chamber with the long reach robot arm of FIG. 1B, according to one aspect of the disclosure.

FIG. 2A illustrates a simplified top view of a portion 200 of a processing system (e.g., a robotic handling system) that employs a quad processing chamber with the long reach robot arm 100B of FIG. 1B, according to one aspect of the disclosure. In various embodiments, the portion 200 of the processing system includes a transfer chamber 205 and at least one processing chamber 215 coupled to the transfer chamber 215. The processing chamber 215 may be a quad processing chamber as shown, or may be another type of processing chamber, e.g., with one wafer station, two wafer stations, or another number of wafer stations. A quad processing chamber is a substrate processing chamber that is able to process four wafers at a time. In alternative embodiments, the portion 200 of the processing system may include one or more additional processing chambers (which may or may not be quad processing chambers) and/or may include other robot arm designs that include dual wafer pockets as described herein. For example, the long reach robot arm 100B may be replaced with long reach robot arm 100A (FIG. 1A) or long reach robot arm 101 (FIG. 1C) in other embodiments.

In some embodiments, although optional, the portion 200 of the processing system includes an additional chamber 220 positioned between the transfer chamber 205 and the processing chamber 215, where the additional chamber 220 is reachable by the first wafer pocket 112A and the second wafer pocket 114A of the long reach robot arm 100B. The additional chamber 220 may be or include a wafer station for temporarily holding wafers in an embodiment. The additional chamber 220 may also be a degas chamber and/or perform other functions on wafers before they are inserted into the processing chamber 215 and/or after they are removed from the processing chamber 215. A degas chamber may perform degassing to remove moisture and other impurities from the air and surface of the wafers. While reference is made to the first wafer pocket 112A and the second wafer pocket 114A, the below description is just as applicable to the third wafer pocket 112B and the fourth wafer pocket 114B, to the fifth wafer pocket 112C and the sixth wafer pocket 114C, or to another pair of wafer pockets on a single end effector. In these embodiments, the processing chamber 215 is reachable by the first wafer pocket but not the second wafer pocket, due to the space used by the additional chamber 220.

In the depicted embodiment, the processing chamber 215 is a quad processing chamber that includes a first substrate support 216A, a second substrate support 216B, a third substrate support 216C, and a fourth substrate support 216D attached to a substrate support framework 218, each of which is to receive and support a wafer of multiple wafers 203 for processing. The substrate support framework 218 may spin or rotate around a central axis to align different substrate supports (e.g., two substrate supports at a time) with a port 222 through which the long reach robot arm may reach. For example, the substrate supports are accessible via the port 222. In embodiments, the substrate support framework 218 is referred to as a rotatable structure for simplicity. In this way, one of the end effectors of the long reach robot arm 100B may be inserted into the processing chamber 215 to deliver or pick up two wafers at a time with the two wafer pockets (when the optional additional chamber 220 is not present). In embodiments, the first substrate support 216A has a first horizontal distance from the robot arm and the second substrate support 216B has a second horizontal distance from the robot arm that is less than the first horizontal distance.

Alternatively, if the additional chamber 220 is present, one of the end effectors of the long reach robot arm 100B may be inserted through the additional chamber 220 and into the processing chamber 215. The end effector may deliver or pick up a first wafer to/from the processing chamber 215 (from first wafer pocket 112A) and a second wafer to/from the additional chamber 220 (from second wafer pocket 114A). In other words, when the additional chamber 220 is present, the long reach robot arm 100B is to place the first wafer from the first wafer pocket into the processing chamber 215 and is further to place the second wafer from the second wafer pocket into the additional chamber 220.

With additional reference to FIG. 2A, the portion 200 of the processing system includes a first interim station 225A coupled to the transfer chamber 205, the interim station 225A to temporarily hold wafers 203 (e.g., unprocessed wafers). In embodiments, a first load lock 230A is coupled to the interim station 225A, where the interim station 225A is positioned between the transfer chamber 205 and the first load lock 230A. The first load lock 230A may be designed to hold unprocessed wafers that have been delivered for processing by the processing system and/or to hold wafers that have been processed by the processing system. The interim station 225A may be within reach of the first wafer pocket 112A and the second wafer pocket 114A. The first load lock 230A may be within reach of the first wafer pocket 112A but not the second wafer pocket 114A. The portion 200 the processing system may further include a second interim station 225B and a second load lock 230B arranged similar to the first interim station 225A and the first load lock 230A, where the second load lock 230B may be designed to receive processed wafers from the long reach robot arm 100B returned from the at least one processing chamber 215 and/or to receive wafers to be processed.

In embodiments, the first load lock 230A and second load lock 230B may each be operatively coupled to a front-end staging area, e.g., front opening unified pods (FOUPS) having wafer cassettes. The front-end staging area may include a factory interface robot to deliver wafers from the wafer cassettes of unprocessed wafers from the front-end staging area to one of the first and second load locks 230A and 230B. The factory interface robot may further retrieve wafers from one of the first and second load locks 230A and 230B and deliver them to the wafer cassettes in the front-end staging area.

Figure 2B:
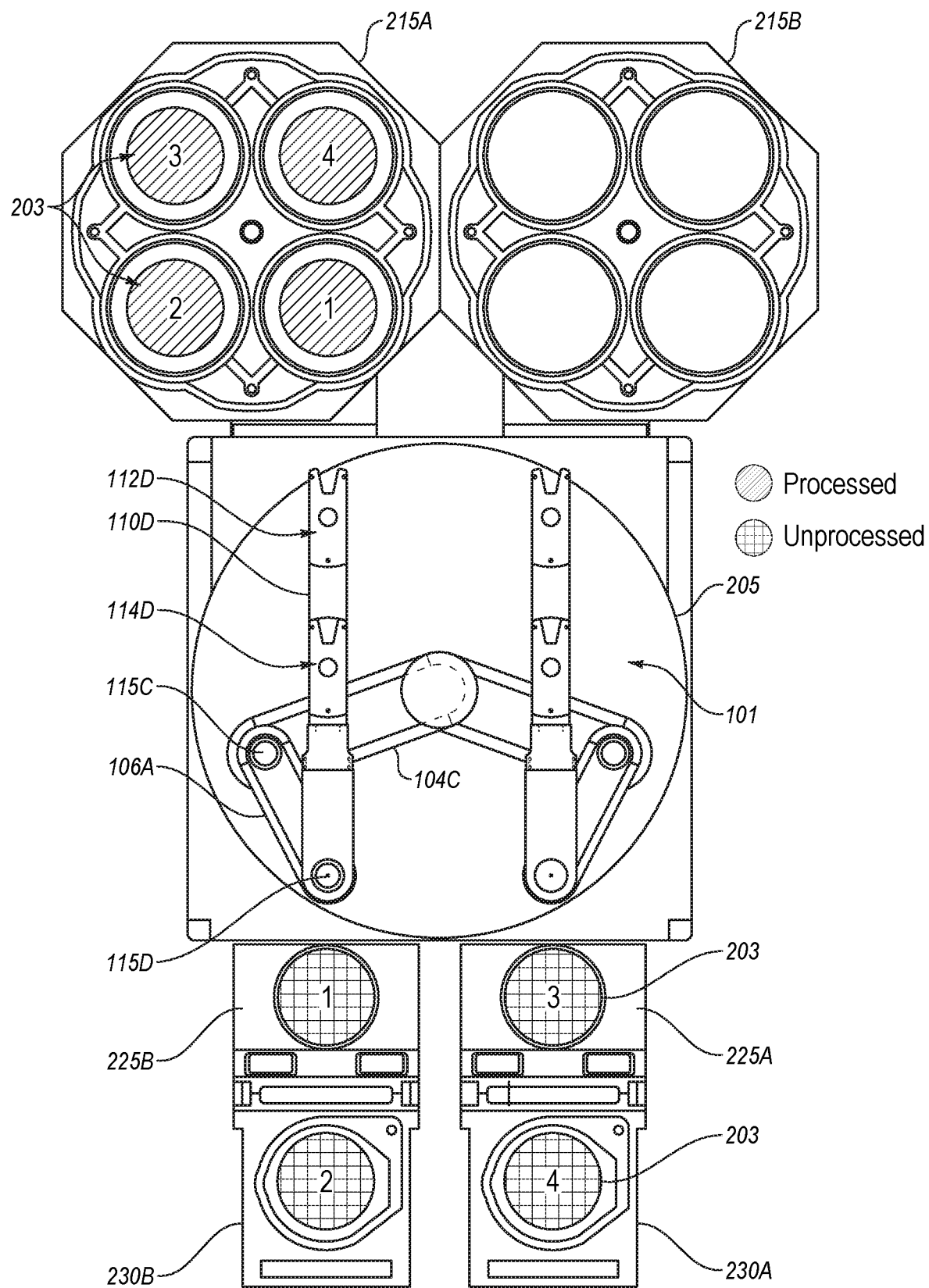
FIG. 2B illustrates a simplified top view of a portion of a processing system that employs two quad processing chambers and the long reach robot arm of FIG. 1C, according to one aspect of the disclosure.

FIG. 2B illustrates a simplified top view of a portion 250 of a processing system that employs two quad processing chambers and the long reach robot arm of FIG. 1C, according to one aspect of the disclosure. In embodiments, the portion 250 of the processing system may be similar to the portion 200 of the processing system illustrated in FIG. 2A, except to include a first quad processing chamber 215A and a second quad processing chamber 215B, each having the substrate support framework 218 and substrate supports as illustrated in FIG. 2A, and without use of the additional chamber 220. This enables use of the long reach robot arm 101 with dual end effectors illustrated in FIG. 1C. In this way, the long reach robot arm 101 is able to insert four wafers at a time into the two quad processing chambers 215A and 215B, e.g., two wafers at a time into each of the first quad processing chamber 215A and the second quad processing chamber 215B.

In other embodiments, the additional chamber 220 is employed between the transfer chamber 205 and each of the first and second quad processing chambers 215A and 215B, such that first wafers in the first wafer pockets are delivered to the first and second quad processing chambers while second wafers in the second wafer pockets are delivered to the additional chambers. In one embodiment, the additional chambers are degas chambers. The long reach robot arm 101 may, once the wafers delivered to the degas chambers, transfer the wafers into the first and second quad processing chambers for processing.

The processing chambers 215A-B may be quad processing chambers as shown, or may be other types of processing chamber (e.g., with one wafer station, two wafer stations, or another number of wafer stations). In alternative embodiments, portion 250 of the processing system may include one or more additional process chambers (which may or may not be quad processing chambers) and/or may include other robot arm designs that include dual wafer pockets as described herein. For example, the long reach robot arm 101 may be replaced with long reach robot arm 100A (FIG. 1A) or long reach robot arm 100B (FIG. 1B) in other embodiments.

In one embodiment, for purposes of explanation, the first motor drive assembly 115C and the second drive motor assembly 115D may work in concert with each other and to actuate the first upper arm and the first middle arm 106A to move the first end effector 110D. These components may move the first end effector 110D along a straight line to insert two wafers (e.g., wafers 1 and 4), one wafer on each of the first and second wafer pockets 112D and 114D, into the first quad processing chamber 215A. The two wafers may be similarly picked up and retracted out of the first quad processing chamber 215A.

Figure 3A:
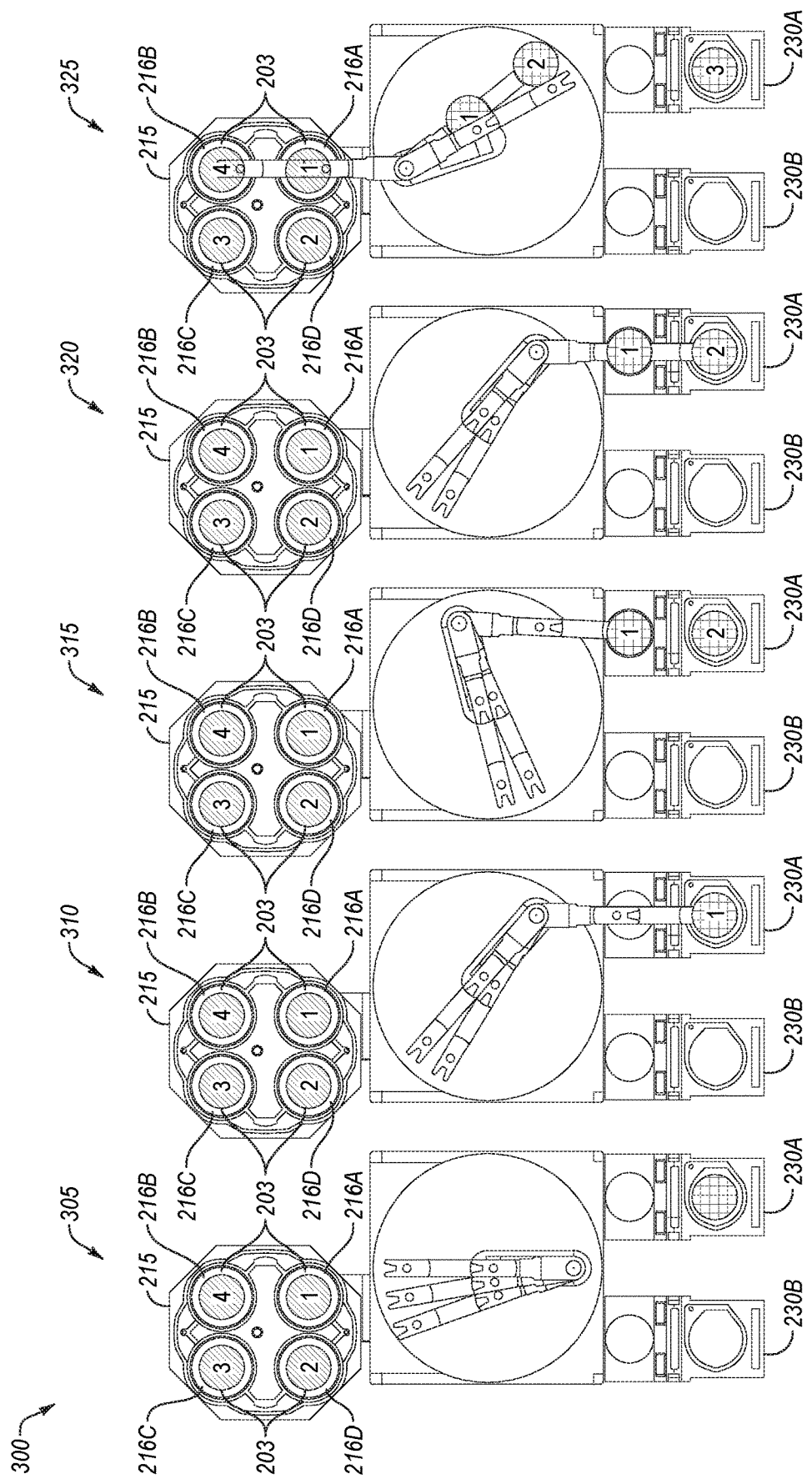
FIGS. 3A-3B illustrate a process flow method using the long reach robot arm of FIG. 1B within the portion of the processing system of FIG. 2A, according to one aspect of the disclosure.
Figure 3B:
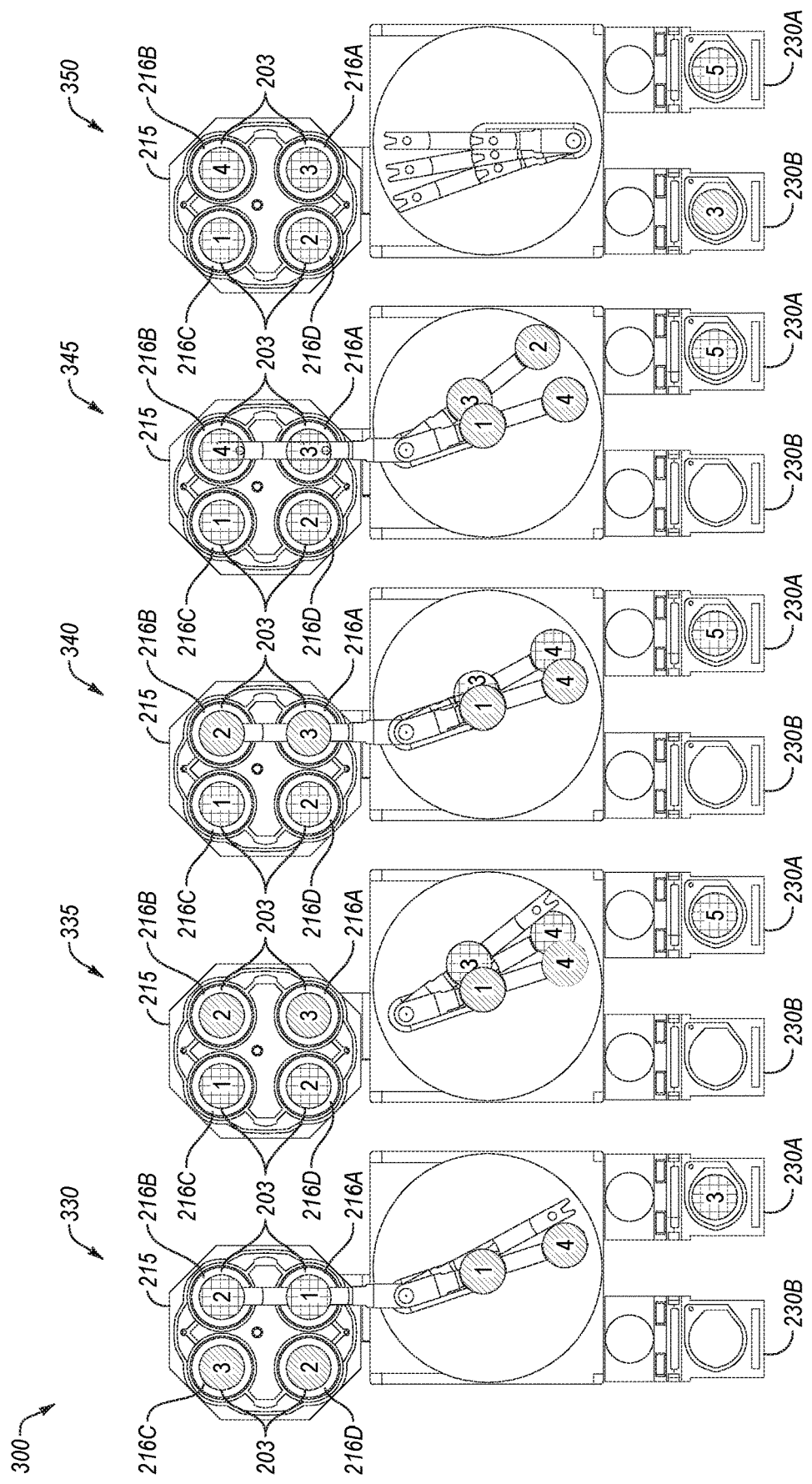

In embodiments using a single wafer pocket on the end effectors of the long reach robot arm 100B, wafer sequencing through the quad processing chamber as illustrated in FIG. 2A, the long reach robot arm 100B conventionally takes 17 movements (or combination of movements) to deliver four processed wafers from the quad processing chamber to the second load lock 230B and three unprocessed wafers from the first load lock 230A to the quad processing chamber. Each movement involves at least one of the end effectors moving positions or swinging from one position to another, involving the biggest delay compared to in-position movements to pick up or set down a wafer. The high number of movements is attributable to each of the three end effectors of the long reach robot arm 100B only having one wafer pocket and being able to only reach to one substrate support of the substrate support framework 118. Embodiments of the present disclosure decrease the number of movements to nine ("9") movements (or combination of movements) that deliver four processed wafers from the quad processing chamber to the second load lock 230B and four unprocessed wafers from the first load lock 230A to the quad processing chamber, thus significantly increasing throughput of the processing system. These movements are illustrated in FIG. 3A and FIG. 3B using dual-pocket end effectors. Note that the temporarily placing a wafer into an interim station to facilitate picking up two wafers at the same time is not counted as a separate movement because this is a quick in-place movement by the end effector.

FIGS. 3A and 3B illustrate a process flow method 300 using the long reach robot arm 100B of FIG. 1B within the portion 200 of the processing system of FIG. 2A (absent additional chamber 220), according to one aspect of the disclosure. With reference to FIG. 3A and FIG. 2A, the method 300 may begin with an initial state in which the first, second, and third end effectors 110A, 110B, and 11C are empty, four processed wafers await in the quad processing chamber, and a number of unprocessed wafers await in the first load lock 230A (305). The method 300 may continue with a second end effector 110B (e.g., with its first wafer pocket) picking up a first unprocessed wafer from the first load lock 230A (310). The method 300 may continue with the second end effector 110B delivering the first unprocessed wafer to the first interim station 225A (315). In embodiments, the first interim station 225A temporarily holds unprocessed wafers to facilitate the end effectors of the long reach robot arm 100B concurrently picking up two wafers. This process is shown with additional clarity in FIGS. 4A-4C.

With continued reference to FIG. 3A and FIG. 2A, the method 300 may continue with the first end effector 110A concurrently picking up the first unprocessed wafer, which is in the first interim station 225A, and a second unprocessed wafer that is still in the first load lock 230A (320). The method 300 may continue with the first end effector 110A concurrently picking up a first and a fourth processed wafers (325). As shown, the first wafer pocket of the first end effector 110A reaches the second substrate support 216B while the second wafer pocket of the second end effector 110B concurrently reaches the first substrate support 216A. The second substrate support 216B and first substrate support 216A may line up such that the first end effector 110A may be inserted approximately along a straight line and position the first wafer pocket at the second substrate support 116B and the second wafer pocket at the first substrate support 216A.

With reference to FIG. 3B and FIG. 2A, the method 300 may continue with the second end effector 110B delivering the first and second unprocessed wafers to the quad processing chamber, e.g., placing them onto the substrate supports from which the first and fourth processed wafers were just removed (330). In particular, the first wafer pocket of the second end effector 110B reaches the second substrate support 216B while the second wafer pocket of the second end effector 110B reaches the first substrate support 216A. The second substrate support 216B and first substrate support 216A may line up such that the second end effector 110B may be inserted approximately along a straight line and position the first wafer pocket at the second substrate support 116B and the second wafer pocket at the first substrate support 216A.

The method 300 may continue with the first end effector 110B picking up a third and a fourth unprocessed wafers same as was done with the first and the second unprocessed wafers, and which will be illustrated in detail with reference to FIGS. 4A-4C (335). After the first and second unprocessed wafers are inserted into the processing chamber 215, the quad processing chamber may rotate the substrate supports about a central axis such that the third substrate support 216C and the fourth substrate support 216D are lined up with the port 222 of the processing chamber 215. More specifically, the quad processing chamber 215 may rotate the substrate support framework 218 to position the third substrate support 216C proximate to the port 222 of the processing chamber 215 and to position the fourth substrate 216D support behind the third substrate support 216C such that the third and fourth substrate supports are accessible via the port 222. This may include rotating the substrate support framework 218 to which the substrate supports are connected by approximately 180 degrees. The substrate support framework 218 may be rotated while the first end effector picks up the third and fourth unprocessed wafers.

The method 300 may continue with the third end effector 110C concurrently picking up the second and the third processed wafers from the processing chamber 215 (340). The method 300 may continue with each of the second and third end effectors delivering each of their two processed wafers (first and fourth wafers, and second and third wafers, respectively), to the second load lock 230B (350). The delivery of the processed wafers to the second load lock 230B may be performed in a similar to fashion as to that illustrated in FIGS. 4A-4C, but in reverse. For example, with reference to the first and fourth wafers, the fourth wafer in the first wafer pocket may be placed into the second load lock 230B while the first wafer in the second wafer pocket may be concurrently placed into second interim station 225B. The first end effector 110A may then be retracted and reinserted into the second interim station 225B to pick up the first wafer in the second interim station with its first wafer pocket and deliver that first wafer to the second load lock 230B. This process may be replicated to deliver processed wafers 2 and 3 to the second load lock 230 as well.

Figure 4A:
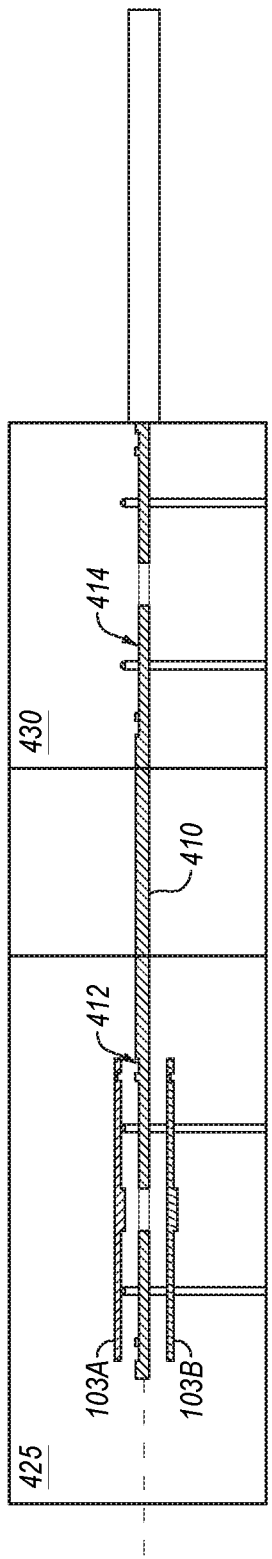
FIG. 4A illustrates a simplified side view of a load lock and a coupled interim station in which a first wafer is retrieved from the load lock, according to one aspect of the disclosure.

FIG. 4A illustrates a simplified side view of a load lock 425 and a coupled interim station 430 in which a first wafer is retrieved from a load lock 425, according to one aspect of the disclosure. With reference to FIG. 4A, in one embodiment an end effector 410 of a long reach robot arm includes a first wafer pocket 412 and a second wafer pocket 414 arranged similarly to the pairs of wafer pockets illustrated in FIGS. 1A, 1B, and 1C. The load lock 425 may include a number of unprocessed wafers, of which are shown a first wafer 103A positioned above a second wafer 103B with a space therebetween. The end effector 410 may be inserted into that space and pick up the first wafer 103A with the first wafer pocket 412.

Figure 4B:
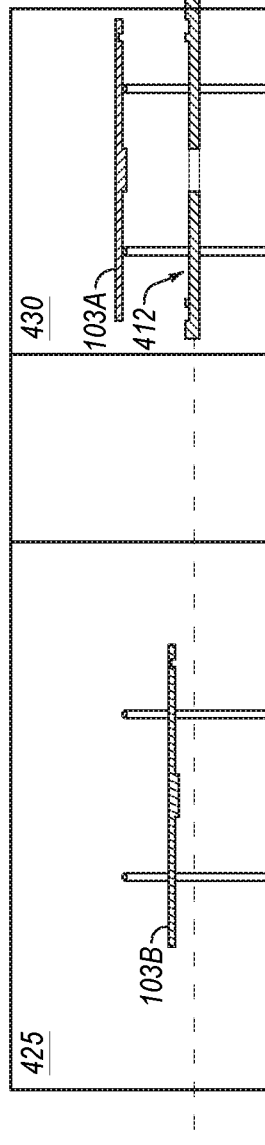
FIG. 4B illustrates the simplified side view of the load lock and interim station of FIG. 4A in which the first wafer is transferred to the interim station.

FIG. 4B illustrates the simplified side view of the load lock 425 and interim station 430 of FIG. 4A in which the first wafer 103A is transferred, e.g., delivered, to the interim station 430. This is done by retracting the end effector 410 and placing the first wafer 103A, which lies on the first wafer pocket 412, into the interim station 430. The interim statin 430 is to temporarily hold the first wafer 103A until both the first wafer 103A and the second wafer 103B are picked up (FIG. 4C).

Figure 4C:
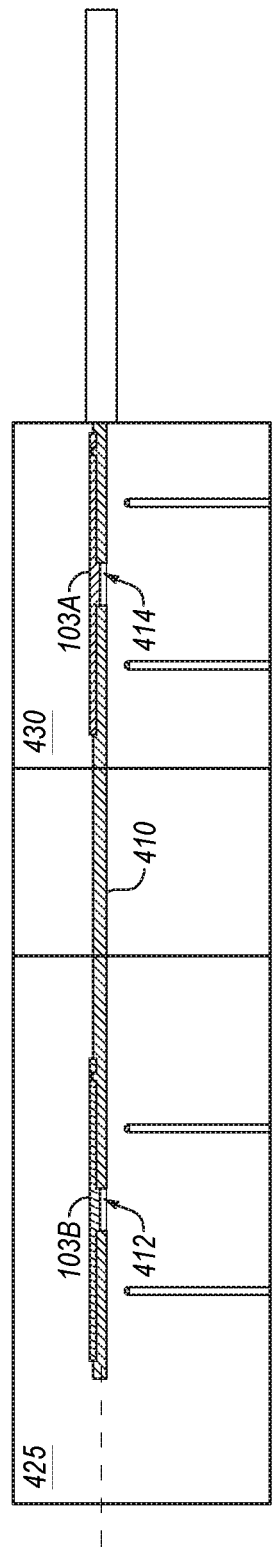
FIG. 4C illustrates the simplified side view of the load lock and interim station of FIG. 4A in which the first wafer and a second wafer are jointly picked up by the end effector, according to one aspect of the disclosure.

FIG. 4C illustrates the simplified side view of the load lock 425 and interim station 430 of FIG. 4A in which the first wafer 103A and the second wafer 103B are jointly picked up by the end effector 410 of the long reach robot arm, according to one aspect of the disclosure. As illustrated, the first wafer 103A now lies on the second wafer pocket 414 and the second wafer 103B now lies on the first wafer pocket 412, and can be moved concurrently to another location.

Figure 5:
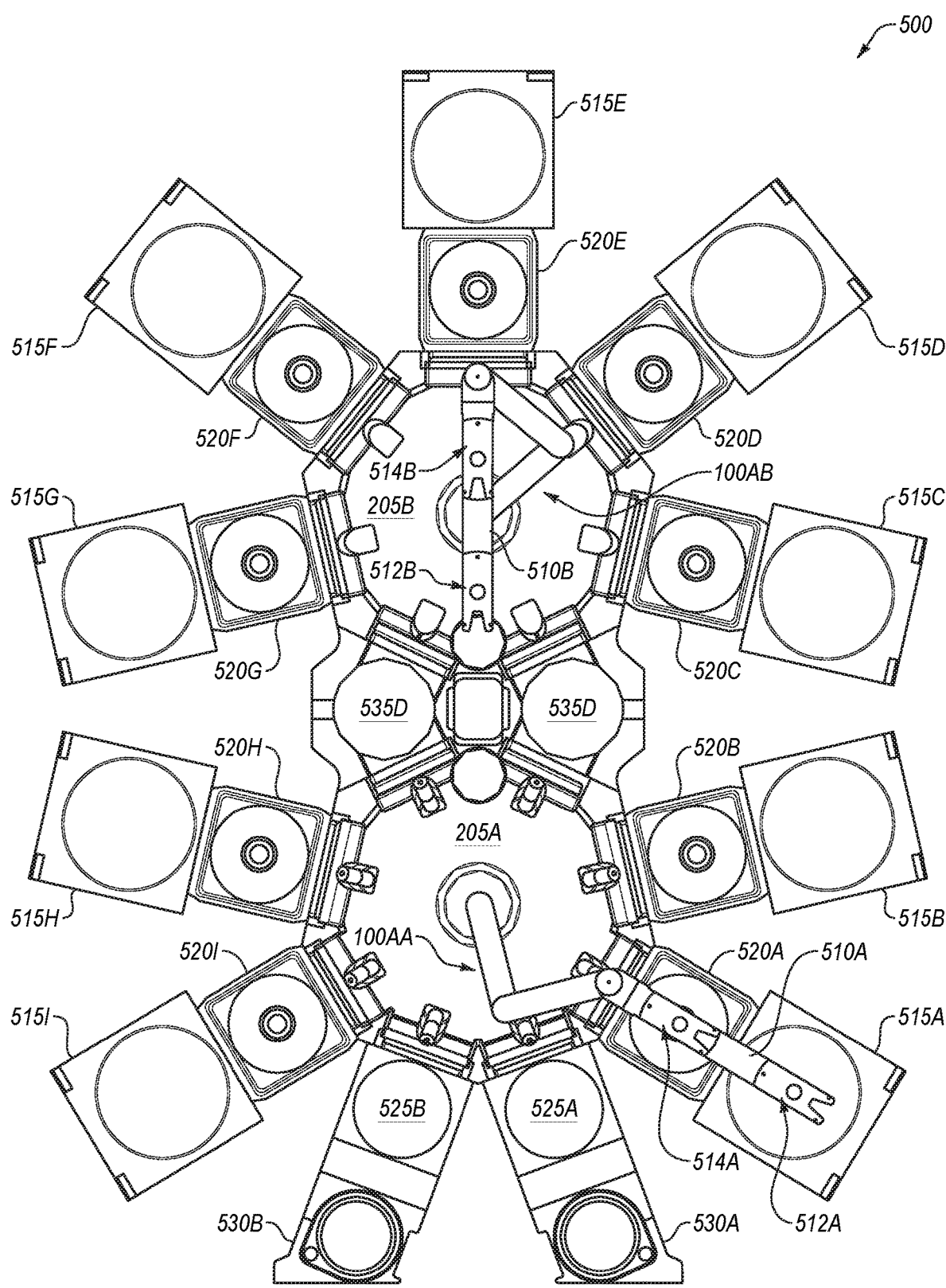
FIG. 5 illustrates a simplified top view of a processing system having multiple processing chambers, according to various aspects of the disclosure.

FIG. 5 illustrates a simplified top view of a processing system 500 having multiple processing chambers, according to various aspects of the disclosure. The processing system 500 of FIG. 5 may include a first transfer chamber 205A and a second transfer chamber 205B coupled together via a first holding chamber 535A and a second holding chamber 535B where wafers may be passed between the first transfer chamber 205A and the second transfer chamber 205B. In embodiments, the first transfer chamber 205A includes a first long reach robot arm 100AA and the second transfer chamber 205B includes a second long reach robot arm 100AB, each of which is modeled after the long reach robot arm 100A of FIG. 1A. In other embodiments, the long reach robot arm in either or both of the first and second transfer chambers is replaced with the long reach robot arm 100B (FIG. 1B), the long reach robot arm 101 (FIG. 1C), or another long reach robot arm with dual pockets.

In various embodiments, the first long reach robot arm 100AA includes a first end effector 510A on which is defined a first wafer pocket 512A and a second wafer pocket 514A. In the embodiments, the second long reach robot arm 100AB includes a second end effector 510B on which is defined a third wafer pocket 512B and a fourth wafer pocket 514B.

In some disclosed embodiments, the multiple processing chambers may include nine processing chambers, including a first processing chamber 515A, a second processing chamber 515B, an eight processing chamber 515H, and a ninth processing chamber 515I coupled to the first transfer chamber 205A. The multiple processing chambers may further include a third processing chamber 515C, a fourth processing chamber 515D, a sixth processing chamber 515E, a sixth processing chamber 515F, and a seventh processing chamber 515G coupled to the second transfer chamber 205B. Other numbers of processing chambers may also be used.

Although optional, the embodiment of FIG. 5 includes multiple additional chambers, where each additional chamber of the multiple additional chambers is positioned between one of the first or second transfer chambers and one of the multiple processing chambers. For example, a first additional chamber 520A may be positioned between the first transfer chamber 205A and the first processing chamber 515A; a second additional chamber 520B may be positioned between the first transfer chamber 205A and the second processing chamber 515B; a third additional chamber 520C may be positioned between the second transfer chamber 205B and the third processing chamber 515C; a fourth additional chamber 520D may be positioned between the second transfer chamber 205B and the fourth processing chamber 515D; a fifth additional chamber 520E may be positioned between the second transfer chamber 205B and the fifth processing chamber 515E; a sixth additional chamber 520F may be positioned between the second transfer chamber 205B and the sixth processing chamber 515F; a seventh additional chamber 520G may be positioned between the second transfer chamber 205B and the seventh processing chamber 515G; an eighth additional chamber 520H may be positioned between the first transfer chamber 205A and the eighth processing chamber 515H; and/or a ninth additional chamber 520I may be positioned between the first transfer chamber 205A and the ninth processing chamber 515I. In one embodiment, the multiple additional chambers are each a degas chamber, another processing chamber, a temporary station, and/or other type of chamber. In some embodiments, each additional chamber is an additional dual-slot chamber into which may be stacked two wafers at different stages of processing.

Due to the mutual coupling of each of the additional chambers to a respective one of the multiple processing chambers, the end effector of each of the first and second long reach robot arms 100 may deliver or pick up two wafers at once from a coupled pair of an additional chamber and a processing chamber. The end effector of the first long reach robot arm 100AA may do so for the pairs of additional chambers and processing chambers coupled to the first transfer chamber 205A and the second long reach robot arm 100AB may do so for the pair of additional chambers and processing chambers coupled to the second transfer chamber 205B. In embodiments, the processing system 500 may further include a first load lock 530A and a second load lock 530B, both coupled to the first transfer chamber 205A, through which unprocessed wafers are passed and processed wafer are returned from the processing system 500. In alternative embodiments, the processing system 500 further includes a first interim station 525A positioned between the first load lock 530A and the first transfer chamber 205A and a second interim station 525B positioned between the second load lock 530B and the first transfer chamber 205A.

In embodiments, the first load lock 530A and second load lock 530B may each be operatively coupled to a front-end staging area, e.g., front opening unified pods (FOUPS) having wafer cassettes. The front-end staging area may include a factory interface robot to deliver wafers from the wafer cassettes of unprocessed wafers from the front-end staging area to one of the first and second load locks 530A and 530B. The factory interface robot may further retrieve wafers from one of the first and second load locks 530A and 530B and deliver them to the wafer cassettes in the front-end staging area.

Figure 6A:
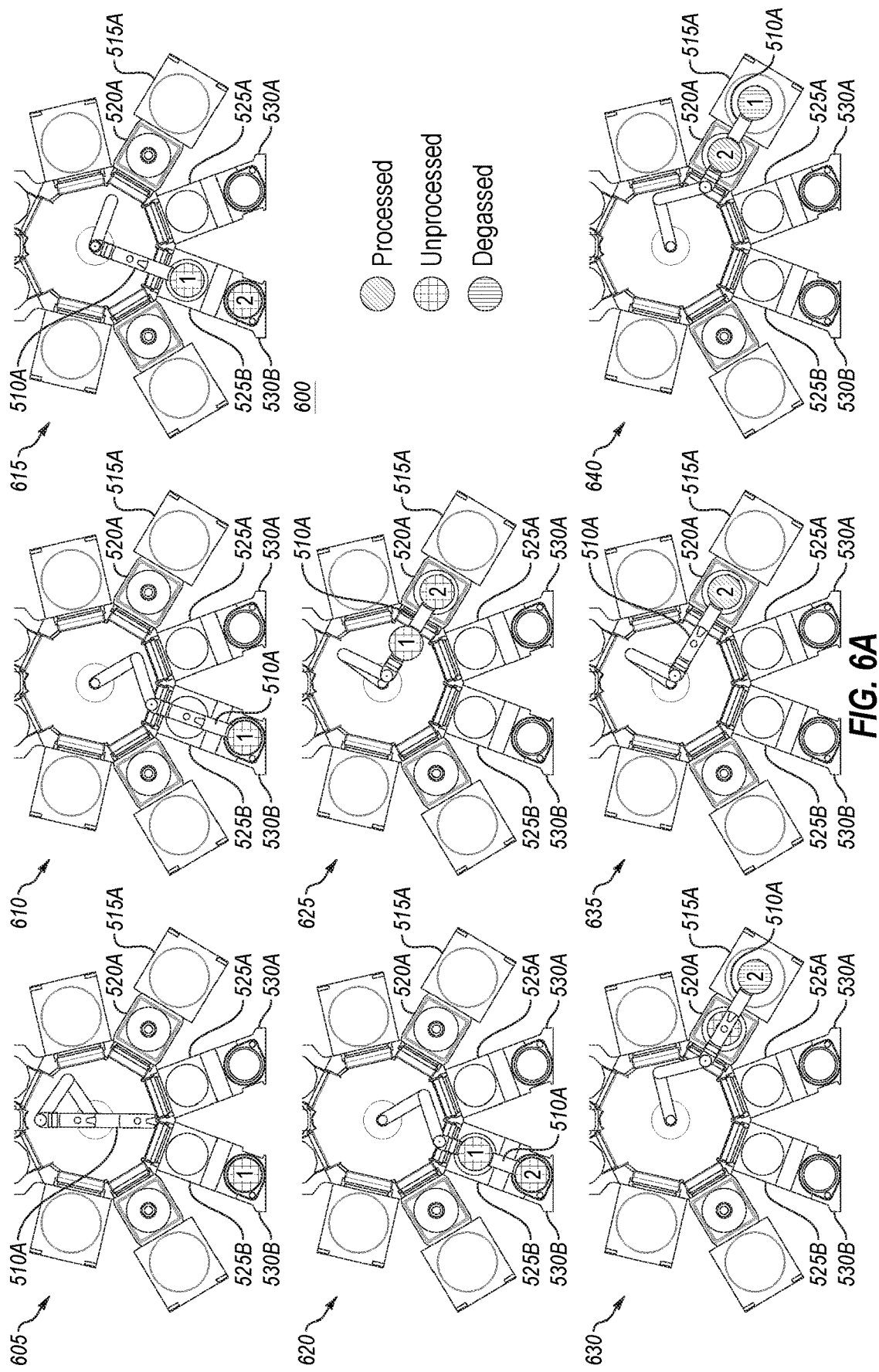
FIG. 6A illustrates a process flow method of the processing system of FIG. 5, according to one aspect of the disclosure.
Figure 6B:
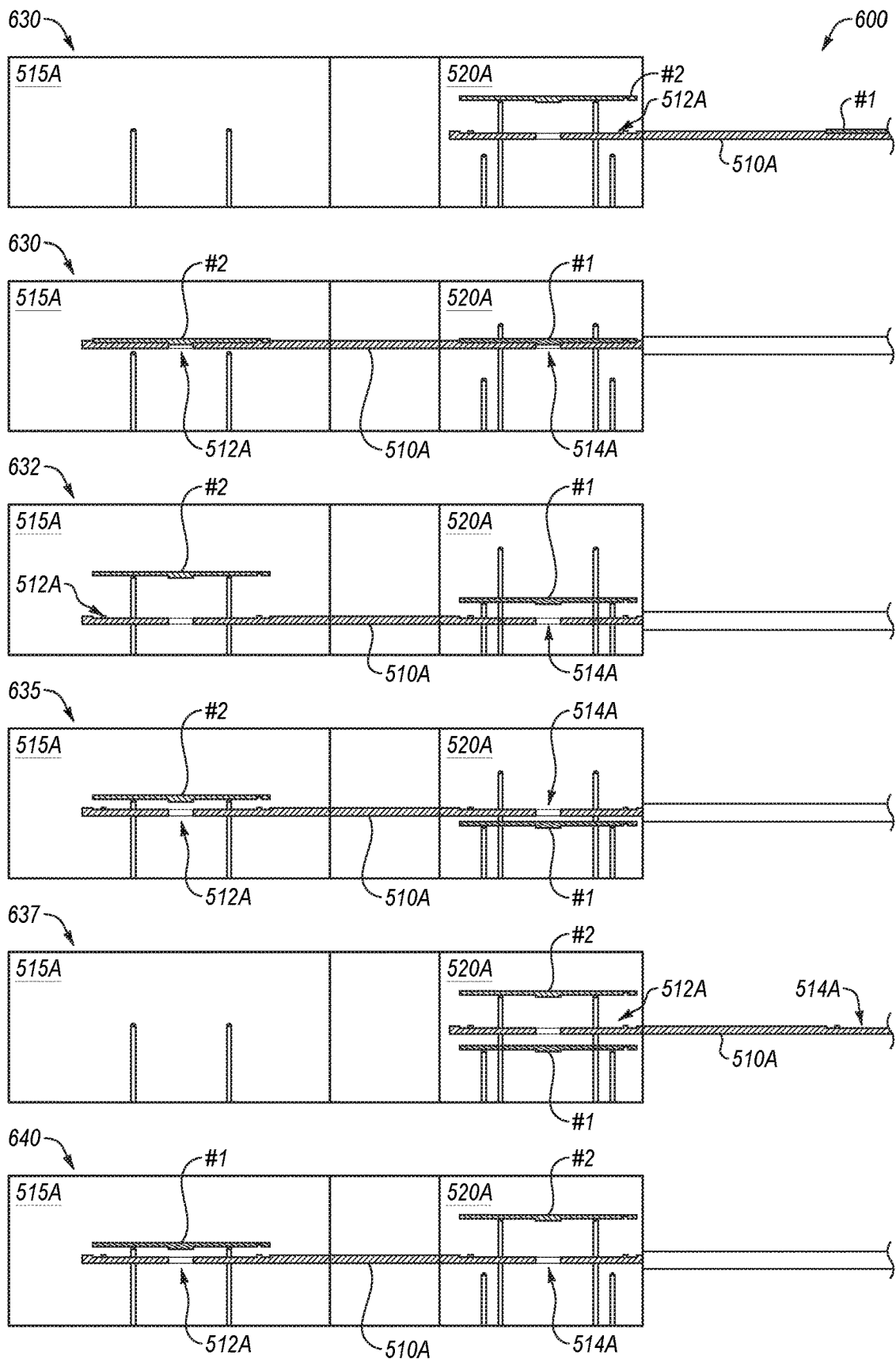
FIG. 6B illustrates aspects of the process flow method of FIG. 6A from a side view, according to aspects of the disclosure.

FIG. 6A illustrates a process flow method 600 of the processing system 500 of FIG. 5, according to one aspect of the disclosure. FIG. 6B illustrates aspects of the process flow method 600 of FIG. 6A from a side view, according to aspects of the disclosure. With additional reference to FIG. 5, in embodiments, the method 600 begins with a number of unprocessed wafers within the second load lock 530B, including at least a first unprocessed wafer and a second unprocessed wafer (605). The method 600 may continue with the first end effector 510A of the first long reach robot arm 100AA picking up the first wafer in its first wafer pocket 512A (610). The method 600 may continue with the first end effector 510A placing the first wafer into the second interim station 525B (615).

With additional reference to FIGS. 5, 6A, and 6B, the method 600 may continue with the first end effector 510A concurrently picking up the first unprocessed wafer in its second wafer pocket 514A and the second unprocessed wafer (which is still in the second load lock 530B) (620). The method 600 may continue with the first end effector 510A placing the second unprocessed wafer into the first additional chamber 520A, e.g., to be degassed (625). The method 600 may continue with the first end effector 510, after the second unprocessed wafer is degassed, placing the degassed second wafer into the first processing chamber 515A while also placing the first unprocessed wafer into the first additional chamber 520A (630). The first end effector 510A may set down the first unprocessed wafer within a bottom slot of the first additional dual-slot chamber 520A, as illustrated in FIG. 6B (632). The method 600 may continue with the first end effector 510A picking up the second wafer, now processed, with its first wafer pocket 512A (635).

In illustrated embodiments, the method 600 may continue with the first end effector 510A placing the second processed wafer within a top slot of the first additional dual-slot chamber 520A, as illustrated in FIG. 6B (637). The method 600 may continue with, after further degassing, the first end effector 510A picking up, from the bottom slot of the first additional dual-slot chamber 520A, the first degassed wafer with its first wafer pocket 512A (640). The method 600 may continue with the first end effector 510A placing the first degassed wafer (on its first wafer pocket) into the first processing chamber 515A (640). Once the degassed first degassed wafer is also processed, the method 600 may continue with the first end effector 510A concurrently removing the first and second processed wafers from the first processing chamber 515A and the first additional chamber 520A, respectively, and placing them into the first load lock 530A, in part via the first interim chamber 525A as previously discussed (not illustrated).

Figure 7:
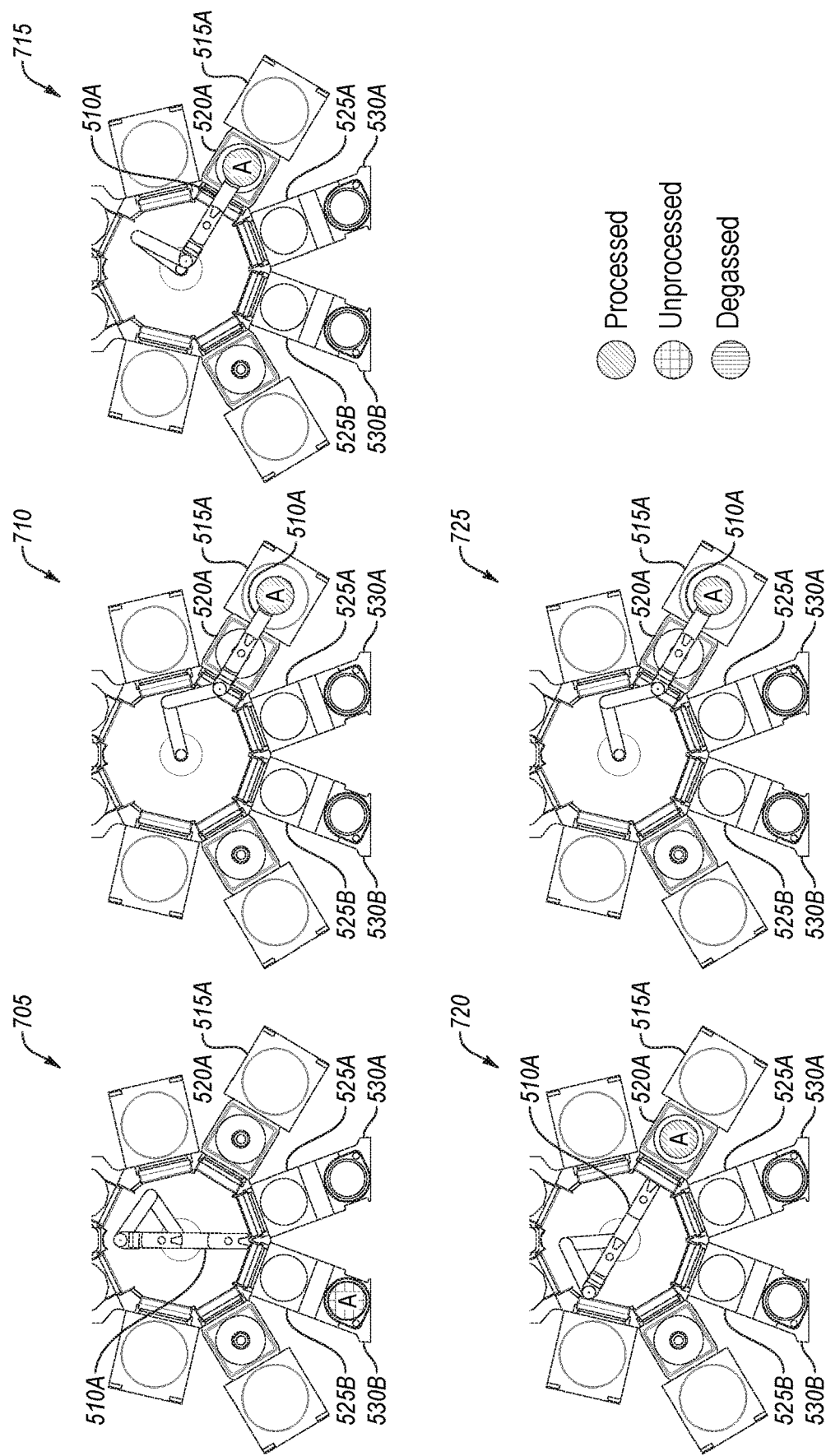
FIG. 7 illustrates an additional process flow method of the processing system of FIG. 5, according to one aspect of the disclosure.

FIG. 7 illustrates an additional process flow method 700 of the processing system 500 of FIG. 5, according to one aspect of the disclosure. With additional reference to FIG. 5, in embodiments, the method 700 begins with a number of unprocessed wafers within the second load lock 530B, including at least a first unprocessed wafer (illustrated as "A") (705). In this embodiment, the additional chambers illustrated in FIG. 5 are rotation chambers adapted to rotate each wafer a number of degrees, such as by 90 degrees or some other target degrees of rotation. Accordingly, the first additional chamber 520A may be a first rotation chamber 520A for purposes of the method 700 of FIG. 7.

The method 700 may continue with the first end effector 510A picking up the first unprocessed wafer from the second load lock 530B and placing the first unprocessed wafer into the first processing chamber 515A for partial processing (710). The method 700 may continue with the first end effector 510 picking up the partially processed wafer from the first processing chamber 515A and placing the partially processed wafer within the first rotation chamber 520A (715). The method 700 may continue with the first rotation chamber 520A rotating the partially processed wafer 90 degrees (or some other number of degrees) (720). The method 700 may continue with the first end effector 510A picking up and placing the rotated, partially processed wafer into the first processing chamber 515A for additional processing (725).

By rotating the wafer after partial processing and before finishing processing within the first processing chamber 515A, the wafer may be more uniformly processed. The ability to employ the rotation chambers is made possible by the long reach robot arms disclosed herein capable of delivering wafers to both the rotation chambers for rotation and to the coupled processing chambers for additional processing. The movements of rotation and additional processing (blocks 715, 720, and 725) may be repeated in time-divided movements of processing to provide additional uniformity to the processed wafer.

Figure 8:
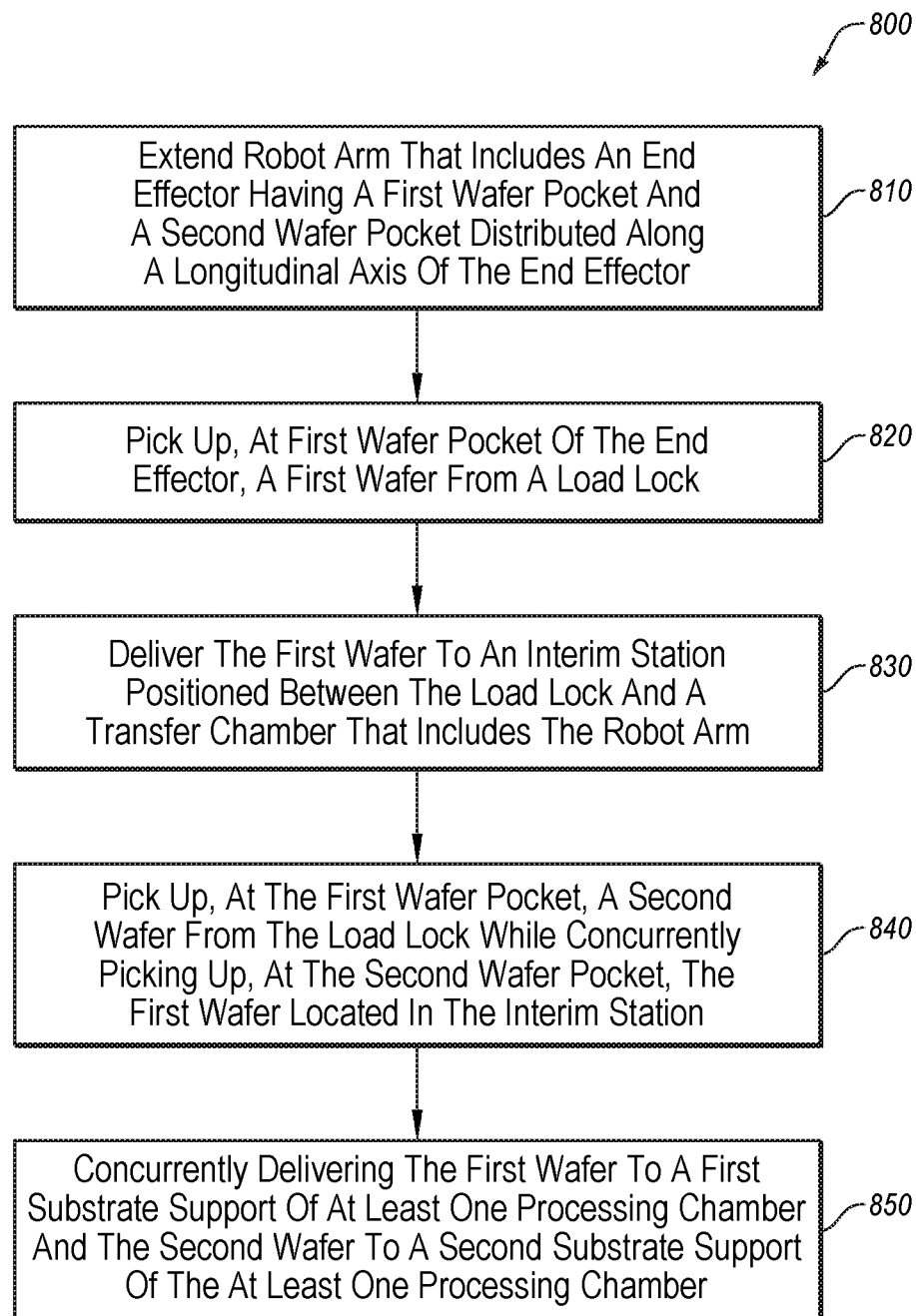
FIG. 8 is a flow chart of a method for using an interim station and a dual-wafer pocket robot arm to pick up two wafers loaded into a load lock chamber, according to one aspect of the disclosure.

FIG. 8 is a flow chart of a method 800 for using an interim station (e.g., the first interim station 225A) and a dual-wafer pocket robot arm (e.g., any illustrated in FIGS. 1A-1C) to pick up two wafers loaded into a load lock chamber (e.g., the first load lock station 230A), according to one aspect of the disclosure. The method 800 may being with extending a robot arm including an end effector having a first wafer pocket and a second wafer pocket, where the first wafer pocket is located at a distal end of the end effector along a longitudinal axis and the second wafer pocket is located at a second position along the longitudinal axis (810). The method 800 may continue with picking up, at the first wafer pocket of the end effector, a first wafer from a load lock (820).

The method 800 may further include delivering, with the end effector, the first wafer to an interim station positioned between the load lock and a transfer chamber comprising the robot arm (830). The method 800 may further include picking up, at the first wafer pocket of the end effector, a second wafer from the load lock while concurrently picking up, at the second wafer pocket of the end effector, the first wafer located in the interim station (840). The method may continue with concurrently delivering, by the end effector, the first wafer to a first substrate support of at least one processing chamber and the second wafer to a second substrate support of the at least one processing chamber (850).

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A robotic handling system comprising:
a transfer chamber;
a robot arm disposed within the transfer chamber and comprising an end effector having a longitudinal axis, wherein the end effector comprises:
a first wafer pocket defined within the end effector at a first location along the longitudinal axis; and
a second wafer pocket defined within the end effector at a second location along the longitudinal axis;
a first chamber coupled to the transfer chamber, wherein the first chamber is reachable by the first wafer pocket and by the second wafer pocket; and
a second chamber coupled to the first chamber, wherein the first chamber is positioned between the transfer chamber and the second chamber, and wherein the second chamber is reachable by the first wafer pocket but not the second wafer pocket.

2. The robotic handling system of claim 1, wherein the first chamber is an interim station and the second chamber is a processing chamber.

3. The robotic handling system of claim 1, wherein the first chamber is a processing chamber and the second chamber is an interim station.

4. The robotic handling system of claim 3, wherein the interim station comprises a first substrate support and the processing chamber comprises a second substrate support, wherein the first substrate support has a first horizontal distance from the robot arm and the second substrate support has a second horizontal distance from the robot arm that is less than the first horizontal distance, and wherein the robot arm is to:
place a first wafer from the first wafer pocket onto the first substrate support; and
place a second wafer from the second wafer pocket onto the second substrate support.

5. The robotic handling system of claim 3, wherein the processing chamber comprises a first substrate support and a second substrate support and the interim station comprises a third substrate support, wherein the third substrate support has a first horizontal distance from the robot arm, the second substrate support has a second horizontal distance from the robot arm that is less than the first horizontal distance, and the first substrate support has a third horizontal distance from the robot arm that is less than the second horizontal distance, and wherein the robot arm is to:
place a first wafer from the first wafer pocket onto the third substrate support; and
place a second wafer from the second wafer pocket onto one of the second substrate support or the first substrate support.

6. The robotic handling system of claim 1, wherein the first chamber is a processing chamber and the second chamber is a degas chamber.

7. The robotic handling system of claim 1, further comprising:
an interim station coupled to the transfer chamber, the interim station to temporarily hold wafers; and
a load lock coupled to the interim station, wherein the interim station is positioned between the transfer chamber and the load lock, wherein the interim station is within reach of the first wafer pocket and the second wafer pocket, and wherein the load lock is within reach of the first wafer pocket but not the second wafer pocket.

8. The robotic handling system of claim 1, further comprising a drive motor operatively coupled to the robot arm to actuate the robot arm, which is to cause the end effector to at least one of:
concurrently deliver a first wafer, on the first wafer pocket, and a second wafer, on the second wafer pocket, to the second chamber and the first chamber, respectively, which are approximately aligned along the longitudinal axis; or
concurrently withdraw the first wafer and the second wafer from the second chamber and the first chamber, respectively, which are approximately aligned along the longitudinal axis.

9. A processing system comprising:
a transfer chamber;
a processing chamber coupled to the transfer chamber, the processing chamber to process wafers;
a robot arm disposed in the transfer chamber and comprising an end effector having a longitudinal axis, wherein the end effector comprises:
a first wafer pocket defined within the end effector at a first location along the longitudinal axis and at a distal end of the end effector; and
a second wafer pocket defined within the end effector at a second location along the longitudinal axis, wherein the end effector is capable of concurrently carrying a first wafer in the first wafer pocket and a second wafer in the second wafer pocket; and
an additional chamber coupled to the processing chamber, wherein the processing chamber is positioned between the transfer chamber and the additional chamber, wherein the processing chamber is within reach of the first wafer pocket and the second wafer pocket, and wherein the additional chamber is within reach of the first wafer pocket but not the second wafer pocket.

10. The processing system of claim 9, wherein the additional chamber is one of an interim station or a degas chamber.

11. The processing system of claim 9, wherein the additional chamber comprises a first substrate support and the processing chamber comprises a second substrate support, wherein the first substrate support has a first horizontal distance from the robot arm and the second substrate support has a second horizontal distance from the robot arm that is less than the first horizontal distance, and wherein the robot arm is to:
place the first wafer from the first wafer pocket onto the first substrate support; and
place the second wafer from the second wafer pocket onto the second substrate support.

12. The processing system of claim 9, wherein the processing chamber comprises a first substrate support and a second substrate support and the additional chamber comprises a third substrate support, wherein the third substrate support has a first horizontal distance from the robot arm, the second substrate support has a second horizontal distance from the robot arm that is less than the first horizontal distance, and the first substrate support has a third horizontal distance from the robot arm that is less than the second horizontal distance, and wherein the robot arm is to:
place the first wafer from the first wafer pocket onto the third substrate support; and
place the second wafer from the second wafer pocket onto one of the second substrate support or the first substrate support.

13. The processing system of claim 12, wherein processing chamber is a quad processing chamber comprising a rotatable structure that comprises the first substrate support, the second substrate support, a fourth substrate support, and a fifth substrate support, wherein the rotatable structure is rotatable around an axis of the quad processing chamber, and wherein:
the robot arm is to pick up a third wafer in the first wafer pocket and a fourth wafer in the second wafer pocket;
the quad processing chamber is to rotate the rotatable structure to position the fifth substrate support proximate to a port of the quad processing chamber and to position the fourth substrate support behind the fifth substrate support such that the fourth substrate support is accessible via the port; and
the robot arm is to place the third wafer from the first wafer pocket onto the fourth substrate support and is further to place the fourth wafer from the second wafer pocket onto the fifth substrate support.

14. The processing system of claim 9, further comprising:
an interim station coupled to the transfer chamber, the interim station to temporarily hold wafers; and
a load lock coupled to the interim station, wherein the interim station is positioned between the transfer chamber and the load lock, wherein the interim station is within reach of the first wafer pocket and the second wafer pocket, and wherein the load lock is within reach of the first wafer pocket but not the second wafer pocket.

15. The processing system of claim 9, further comprising a drive motor operatively coupled to the robot arm to actuate the robot arm, which is to cause the end effector to at least one of:
concurrently deliver a first wafer, on the first wafer pocket, and a second wafer, on the second wafer pocket, to the additional chamber and the processing chamber, respectively, which are approximately aligned along the longitudinal axis; or
concurrently withdraw the first wafer and the second wafer from the additional chamber and the processing chamber, respectively, which are approximately aligned along the longitudinal axis.

16. A method comprising:
extending, from a transfer chamber, a robot arm comprising an end effector having a first wafer pocket and a second wafer pocket, wherein the first wafer pocket is located at a distal end and first position of the end effector along a longitudinal axis and the second wafer pocket is located at a second position along the longitudinal axis;
picking up, at the first wafer pocket of the end effector, a first wafer from a load lock;
delivering the first wafer to an interim station positioned between the load lock and a transfer chamber comprising the robot arm;
picking up, at the first wafer pocket of the end effector, a second wafer from the load lock while concurrently picking up, at the second wafer pocket of the end effector, the first wafer located in the interim station; and
concurrently placing, with the end effector, the first wafer on a second substrate support of a second chamber and the second wafer on a first substrate support of a first chamber, wherein the first chamber is positioned between the transfer chamber and the second chamber.

17. The method of claim 16, wherein the second chamber is a quad processing chamber comprising a rotatable structure that comprises the second substrate support, a third substrate support, a fourth substrate support, and a fifth substrate support, wherein the rotatable structure is rotatable around an axis of the quad processing chamber, further comprising:
picking up, with the robot arm, a third wafer in the first wafer pocket and a fourth wafer in the second wafer pocket;
rotating, by the quad processing chamber, the rotatable structure to position the fifth substrate support proximate to a port of the quad processing chamber and to position the fourth substrate support behind the fifth substrate support such that the third substrate support is accessible via the port; and
placing, by the robot arm, the third wafer from the first wafer pocket onto the fourth substrate support and the fourth wafer from the second wafer pocket onto the fifth substrate support.

18. The method of claim 16, wherein the first chamber comprises a processing chamber coupled to the transfer chamber, wherein the processing chamber is reachable by the first wafer pocket and the second wafer pocket, and wherein the second chamber is an additional chamber coupled to the processing chamber, the method further comprising concurrently:
placing the first wafer from the first wafer pocket into the additional chamber and onto the second substrate support; and
placing the second wafer from the second wafer pocket into the processing chamber and onto the first substrate support.

19. The method of claim 16, wherein the second chamber is a degas chamber.

20. The method of claim 16, further comprising causing, by a drive motor operatively coupled to the robot arm, the end effector to at least one of: a) concurrently deliver the first wafer and the second wafer to respective destinations that are approximately aligned along the longitudinal axis; or b) concurrently withdraw the first wafer and the second wafer from respective locations that are approximately aligned along the longitudinal axis.

* * * * *